(12) United States Patent
Kajiwara et al.

(10) Patent No.: US 11,476,358 B2
(45) Date of Patent: Oct. 18, 2022

(54) SEMICONDUCTOR DEVICE

(71) Applicant: KABUSHIKI KAISHA TOSHIBA, Tokyo (JP)

(72) Inventors: Yosuke Kajiwara, Yokohama (JP); Aya Shindome, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 7 days.

(21) Appl. No.: 17/151,713

(22) Filed: Jan. 19, 2021

(65) Prior Publication Data

US 2022/0045202 A1 Feb. 10, 2022

(30) Foreign Application Priority Data

Aug. 6, 2020 (JP) .............................. JP2020-133831

(51) Int. Cl.
*H01L 29/778* (2006.01)
*H01L 29/43* (2006.01)
*H01L 29/20* (2006.01)

(52) U.S. Cl.
CPC ........ *H01L 29/778* (2013.01); *H01L 29/2003* (2013.01); *H01L 29/432* (2013.01)

(58) Field of Classification Search
CPC ......... H01L 29/66431; H01L 29/66462; H01L 29/778–7789
See application file for complete search history.

(56) References Cited

U.S. PATENT DOCUMENTS

| 7,456,443 | B2 | 11/2008 | Saxler et al. |
| 8,044,433 | B2 * | 10/2011 | Kawasaki ........... H01L 29/7787 257/283 |
| 2018/0097096 | A1 | 4/2018 | Sugiyama et al. |

(Continued)

FOREIGN PATENT DOCUMENTS

| JP | 2006-156429 A | 6/2006 |
| JP | 2008-521248 A | 6/2008 |

(Continued)

*Primary Examiner* — Eric A. Ward
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor layers, and an insulating member. The third electrode in a first direction is between the first and second electrodes in the first direction. The first direction is from the first toward second electrode. The first semiconductor layer includes $Al_{x1}Ga_{1-x1}N$ ($0 \le x1 < 1$), and first to sixth partial regions. A second direction from the first partial region toward the first electrode crosses the first direction. The second semiconductor layer includes $Al_{x2}Ga_{1-x2}N$ ($0 < x2 < 1$ and $x1 < x2$), and first and second semiconductor regions. A direction from the fourth partial region toward the first semiconductor region is along the second direction. A direction toward the second semiconductor region from the fifth and sixth partial regions is along the second direction. The insulating member includes first to third insulating regions.

20 Claims, 5 Drawing Sheets

(56) References Cited

U.S. PATENT DOCUMENTS

| | | | |
|---|---|---|---|
| 2018/0130873 A1* | 5/2018 | Eum | .................. H01L 29/812 |
| 2020/0105917 A1 | 4/2020 | Okita et al. | |
| 2020/0335587 A1 | 10/2020 | Ono et al. | |

FOREIGN PATENT DOCUMENTS

| | | |
|---|---|---|
| JP | 2014-007389 A | 1/2014 |
| JP | 2018-060847 A | 4/2018 |
| JP | 2020-053585 A | 4/2020 |
| JP | 2020-178068 A | 10/2020 |

\* cited by examiner

SEMICONDUCTOR DEVICE

CROSS-REFERENCE TO RELATED APPLICATIONS

This application is based upon and claims the benefit of priority from Japanese Patent Application No. 2020-133831, filed on Aug. 6, 2020; the entire contents of which are incorporated herein by reference.

FIELD

Embodiments described herein generally relate to a semiconductor device.

BACKGROUND

For example, there is a semiconductor device such as a transistor or the like that uses a nitride semiconductor. Stable characteristics of the semiconductor device are desirable.

DETAILED DESCRIPTION

Figure 1:
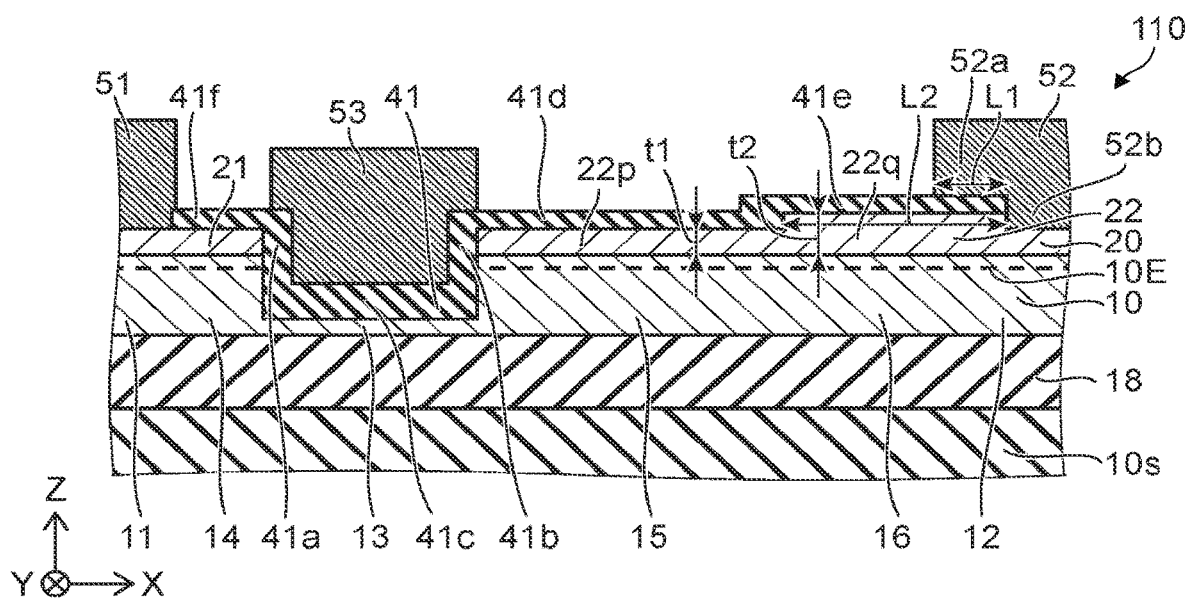
FIG. 1 is a schematic cross-sectional view illustrating a semiconductor device according to a first embodiment.

According to one embodiment, a semiconductor device includes a first electrode, a second electrode, a third electrode, a first semiconductor layer, a second semiconductor layer, and a first insulating member. A position of the third electrode in a first direction is between a position of the first electrode in the first direction and a position of the second electrode in the first direction. The first direction is from the first electrode toward the second electrode. The first semiconductor layer includes $Al_{x1}Ga_{1-x1}N$ ($0 \le x1 < 1$) and includes a first partial region, a second partial region, a third partial region, a fourth partial region, a fifth partial region, and a sixth partial region. A second direction from the first partial region toward the first electrode crosses the first direction. A direction from the second partial region toward the second electrode is along the second direction. A direction from the third partial region toward the third electrode is along the second direction. A position in the first direction of the fourth partial region is between a position in the first direction of the first partial region and a position in the first direction of the third partial region. A position in the first direction of the fifth partial region is between the position in the first direction of the third partial region and a position in the first direction of the second partial region. A position in the first direction of the sixth partial region is between the position in the first direction of the fifth partial region and the position in the first direction of the second partial region. The second semiconductor layer includes $Al_{x2}Ga_{1-x2}N$ ($0 < x2 < 1$ and $x1 < x2$) and includes a first semiconductor region and a second semiconductor region. A direction from the fourth partial region toward the first semiconductor region is along the second direction. A direction toward the second semiconductor region from the fifth and sixth partial regions is along the second direction. At least a portion of the third electrode is between the first semiconductor region and the second semiconductor region in the first direction. The second semiconductor region includes a first semiconductor part and a second semiconductor part. The first semiconductor part is between the second semiconductor part and the at least a portion of the third electrode in the first direction. A first thickness along the second direction of the first semiconductor part is less than a second thickness along the second direction of the second semiconductor part. The first insulating member includes a first insulating region, a second insulating region, and a third insulating region. The first insulating region is between the first semiconductor region and the at least a portion of the third electrode in the first direction. The second insulating region is between the second semiconductor region and the at least a portion of the third electrode in the first direction. The third insulating region is between the third partial region and the third electrode in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor layer 10, a second semiconductor layer 20, and a first insulating member 41.

A first direction from the first electrode 51 toward the second electrode 52 is taken as an X-axis direction. One direction perpendicular to the X-axis direction is taken as a Z-axis direction. A direction perpendicular to the X-axis direction and the Z-axis direction is taken as a Y-axis direction.

The position of the third electrode 53 in the first direction (the X-axis direction) is between the position of the first electrode 51 in the first direction and the position of the second electrode 52 in the first direction.

The first semiconductor layer 10 includes $Al_{x1}Ga_{1-x1}N$ ($0 \le x1 < 1$). The first semiconductor layer 10 includes, for example, GaN. When the first semiconductor layer 10 includes Al, the Al composition ratio is not less than 0 and not more than 0.15.

The first semiconductor layer 10 includes a first partial region 11, a second partial region 12, a third partial region 13, a fourth partial region 14, a fifth partial region 15, and a sixth partial region 16. A second direction from the first partial region 11 toward the first electrode 51 crosses the first direction (the X-axis direction). The second direction is, for example, the Z-axis direction.

The direction from the second partial region 12 toward the second electrode 52 is along the second direction (e.g., the Z-axis direction). The direction from the third partial region 13 toward the third electrode 53 is along the second direction (e.g., the Z-axis direction). The position in the first direction (the X-axis direction) of the fourth partial region 14 is between the position in the first direction of the first partial region 11 and the position in the first direction of the third partial region 13. The position in the first direction of the fifth partial region 15 is between the position in the first direction of the third partial region 13 and the position in the first direction of the second partial region 12. The position in the first direction of the sixth partial region 16 is between the position in the first direction of the fifth partial region 15 and the position in the first direction of the second partial region 12.

The second semiconductor layer 20 includes $Al_{x2}Ga_{1-x2}N$ (0<x2<1 and x1<x2). The second semiconductor layer 20 includes AlGaN or AlN. The Al composition ratio in the second semiconductor layer 20 is, for example, not less than 0.05 and not more than 1.00.

The second semiconductor layer 20 includes a first semiconductor region 21 and a second semiconductor region 22. The direction from the fourth partial region 14 toward the first semiconductor region 21 is along the second direction (the Z-axis direction). The direction toward the second semiconductor region 22 from the fifth and sixth partial regions 15 and 16 is along the second direction (the Z-axis direction). At least a portion of the third electrode 53 is between the first semiconductor region 21 and the second semiconductor region 22 in the first direction (the X-axis direction).

The second semiconductor region 22 includes a first semiconductor part 22p and a second semiconductor part 22q. The first semiconductor part 22p is between the second semiconductor part 22q and at least a portion of the third electrode 53 in the first direction (the X-axis direction). For example, the direction from the fifth partial region 15 toward the first semiconductor part 22p is along the Z-axis direction. For example, the direction from the sixth partial region 16 toward the second semiconductor part 22q is along the Z-axis direction.

A first thickness t1 along the second direction (the Z-axis direction) of the first semiconductor part 22p is less than a second thickness t2 along the second direction of the second semiconductor part 22q.

The first insulating member 41 includes a first insulating region 41a, a second insulating region 41b, and a third insulating region 41c. The first insulating region 41a is between the first semiconductor region 21 and the at least a portion of the third electrode 53 recited above in the first direction (the X-axis direction). The second insulating region 41b is between the second semiconductor region 22 and the at least a portion of the third electrode 53 recited above in the first direction (the X-axis direction). The third insulating region 41c is between the third partial region 13 and the third electrode 53 in the second direction (e.g., the Z-axis direction).

For example, the current between the first electrode 51 and the second electrode 52 can be controlled by the potential (e.g., the potential referenced to the potential of the first electrode 51) of the third electrode 53. The first electrode 51 is, for example, a source electrode. The second electrode 52 is, for example, a drain electrode. The third electrode 53 is, for example, a gate electrode. The first insulating region 41a, the second insulating region 41b, and the third insulating region 41c are, for example, gate insulating films. The semiconductor device 110 is, for example, a transistor.

For example, a carrier region 10E is formed in the portion of the first semiconductor layer 10 corresponding to the second semiconductor layer 20. The carrier region 10E is, for example, a two-dimensional electron gas. The semiconductor device 110 is, for example, a HEMT (High Electron Mobility Transistor).

In the semiconductor device 110, a portion of the third electrode 53 is buried in the second semiconductor layer 20. The semiconductor device 110 has a recessed gate structure. For example, the carrier region 10E that is between the first electrode 51 and the second electrode 52 is divided by the third electrode 53 and the first insulating member 41. For example, a normally-off characteristic is obtained.

As shown in FIG. 1, the semiconductor device 110 may include a base body 10s and a buffer layer 18. The base body 10s includes, for example, at least one selected from the group consisting of silicon, silicon carbide, sapphire, and gallium nitride. The buffer layer 18 is located on the base body 10s. The buffer layer 18 includes, for example, a nitride semiconductor. The first semiconductor layer 10 is located on the buffer layer 18. The second semiconductor layer 20 is located on the first semiconductor layer 10.

In the embodiment, the first thickness t1 along the second direction (the Z-axis direction) of the first semiconductor part 22p is less than the second thickness t2 along the second direction of the second semiconductor part 22q as described above. By such a configuration, for example, gate leakage can be suppressed. For example, current collapse can be suppressed. According to the embodiment, a semiconductor device can be provided in which stable characteristics are obtained.

Figure 2:
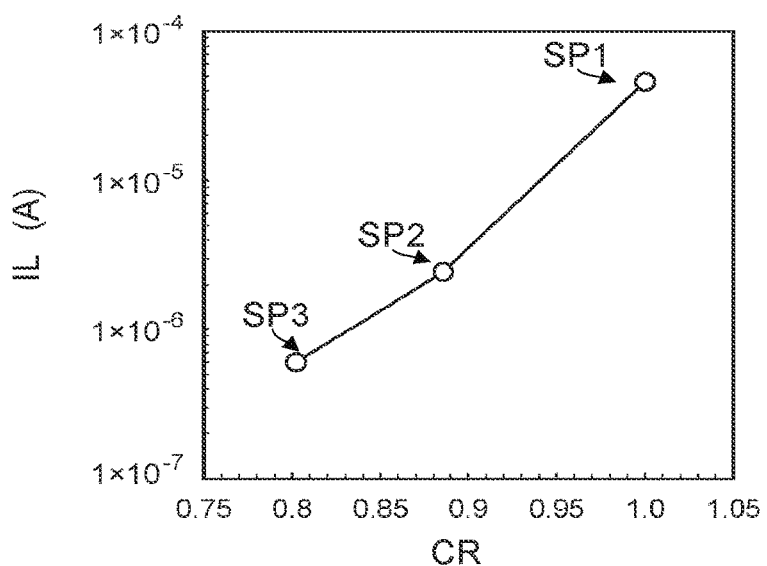
FIG. 2 is a graph illustrating a characteristic of the semiconductor device.

FIG. 2 is a graph illustrating a characteristic of the semiconductor device.

FIG. 2 illustrates measurement results of gate leakage of a first sample SP1, a second sample SP2, and a third sample SP3. The thickness of the second semiconductor region 22 is constant in these samples. The carrier concentrations (the electron carrier concentrations) in the carrier region 10E are different between these samples. The horizontal axis of FIG. 2 is a relative value of a carrier concentration CR. The carrier concentration CR of the first sample SP1 is normalized as 1. The vertical axis of FIG. 2 is a gate leakage current IL. As shown in FIG. 2, the gate leakage current IL decreases as the carrier concentration CR decreases.

Compared to a normally-on semiconductor device that does not have a recessed gate structure, the effects of the parasitic capacitance between the second electrode 52 and the third electrode 53 are large for a recessed gate structure. It is desirable for the carrier concentration CR of the carrier region 10E to be low in a recessed gate structure. In particular, it is desirable for the carrier concentration CR of the carrier region 10E directly under the gate electrode at the vicinity of the third electrode 53 to be low. The switching loss can be reduced thereby.

Thus, from the perspective of the gate leakage current IL, it is favorable for the carrier concentration CR of the carrier region 10E to be low in a semiconductor device that has a recessed gate structure. In particular, it is desirable for the carrier concentration CR of the carrier region 10E at the vicinity of the third electrode 53 to be low.

However, it was found that when the thickness of the second semiconductor region 22 is constant, current collapse easily occurs if the carrier concentration CR is low. When current collapse occurs, for example, the on-resistance increases after voltage stress is applied. For example, the carrier concentration CR of the carrier region 10E is greater when the Al composition ratio in the second semiconductor layer 20 is high than when the Al composition ratio is low. It was found that the increase of the on-resistance after the voltage stress is applied can be suppressed more when the Al composition ratio in the second semiconductor layer 20 is high than when the Al composition ratio is low.

For example, it is considered that the carrier concentration CR of the carrier region 10E decreases or the carrier region 10E disappears between the gate electrode and the drain electrode when high-voltage stress is applied. It is considered that various traps are formed thereby, and current collapse is caused thereby. It is considered that when the carrier concentration CR is high, the decrease of the carrier concentration CR of the carrier region 10E or the disappearance of the carrier region 10E can be suppressed even when a high-voltage stress is applied. In particular, it is desirable for the carrier concentration CR of the carrier region 10E at the vicinity of the second electrode 52 to be high.

Accordingly, the demands on the carrier concentration CR of the carrier region 10E are reversed between the perspective of the gate leakage current and the perspective of current collapse.

In the embodiment, the first thickness t1 along the second direction (the Z-axis direction) of the first semiconductor part 22p is less than the second thickness t2 along the second direction of the second semiconductor part 22q as described above. Thereby, for example, the carrier concentration CR can be reduced at the vicinity of the third electrode 53. Also, the carrier concentration CR can be increased at the vicinity of the second electrode 52. The gate leakage that occurs at the vicinity of the third electrode 53 can be suppressed thereby. Also, current collapse, which is considered to be caused by the characteristics of the second electrode 52 vicinity, can be suppressed. According to the embodiment, a semiconductor device can be provided in which stable characteristics are obtained.

In one example, for example, the difference between the thickness of the first semiconductor part 22p and the thickness of the second semiconductor part 22q is obtained by forming a semiconductor layer used to form these parts, and by subsequently removing a portion of the semiconductor layer. In another example, the difference described above may be obtained by forming another semiconductor layer on a portion of the semiconductor layer used to form the first semiconductor part 22p as described below.

As shown in FIG. 1, the first insulating member 41 may further include a fourth insulating region 41d and a fifth insulating region 41e. For example, the first semiconductor part 22p is between the fifth partial region 15 and the fourth insulating region 41d. The second semiconductor part 22q is between the sixth partial region 16 and the fifth insulating region 41e.

In the example, a portion of the fifth insulating region 41e is between a portion of the second semiconductor part 22q and a portion of the second electrode 52 in the second direction (the Z-axis direction). The second semiconductor part 22q contacts the second electrode 52.

As shown in FIG. 1, for example, the second electrode 52 includes a first electrode part 52a and a second electrode part 52b. A portion of the second semiconductor part 22q is between the sixth partial region 16 and the first electrode part 52a in the second direction (the Z-axis direction). The direction from the portion of the second semiconductor part 22q described above toward the second electrode part 52b is along the first direction (the X-axis direction). The portion of the second semiconductor part 22q described above contacts the second electrode part 52b. By such a configuration, the electrical connection with the second electrode 52 is further stabilized.

As shown in FIG. 1, the length along the first direction (the X-axis direction) of the first electrode part 52a (the part that overlaps the second semiconductor part 22q) is taken as a length L1. It is favorable for the length L1 to be not less than 0.01 μm and not more than 0.2 μm. The length L1 corresponds to the overlap amount. By such a length L1, a more stable electrical connection is obtained. For example, current collapse can be more stably suppressed.

As shown in FIG. 1, the length along the first direction (the X-axis direction) of the second semiconductor part 22q (the thick part) is taken as a length L2. It is favorable for the length L2 to be not less than 0.3 μm and not more than 7 μm. The region where the carrier concentration CR is high is more stably obtained. For example, current collapse can be more stably suppressed.

As shown in FIG. 1, the first insulating member 41 may further include a sixth insulating region 41f. The first semiconductor region 21 is between the fourth partial region 14 and the sixth insulating region 41f in the Z-axis direction.

For example, the fourth insulating region 41d and the fifth insulating region 41e cover the second semiconductor region 22. For example, the sixth insulating region 41f covers the first semiconductor region 21. The second semiconductor layer 20 is protected by providing the fourth insulating region 41d, the fifth insulating region 41e, and the sixth insulating region 41f. More stable characteristics are obtained.

In the embodiment, the first insulating region 41a, the second insulating region 41b, and the third insulating region 41c are continuous with each other. For example, the first insulating region 41a, the second insulating region 41b, the third insulating region 41c, the fourth insulating region 41d, and the fifth insulating region 41e may be continuous with each other. The first to sixth insulating regions 41a to 41f may be continuous with each other.

The first insulating member 41 includes, for example, silicon and oxygen. The first insulating member 41 may include, for example, $SiO_2$, SiON, etc. The first insulating member 41 may include, for example, Al. The first insulating member 41 may include, for example, AlSiO, etc.

Figure 3:
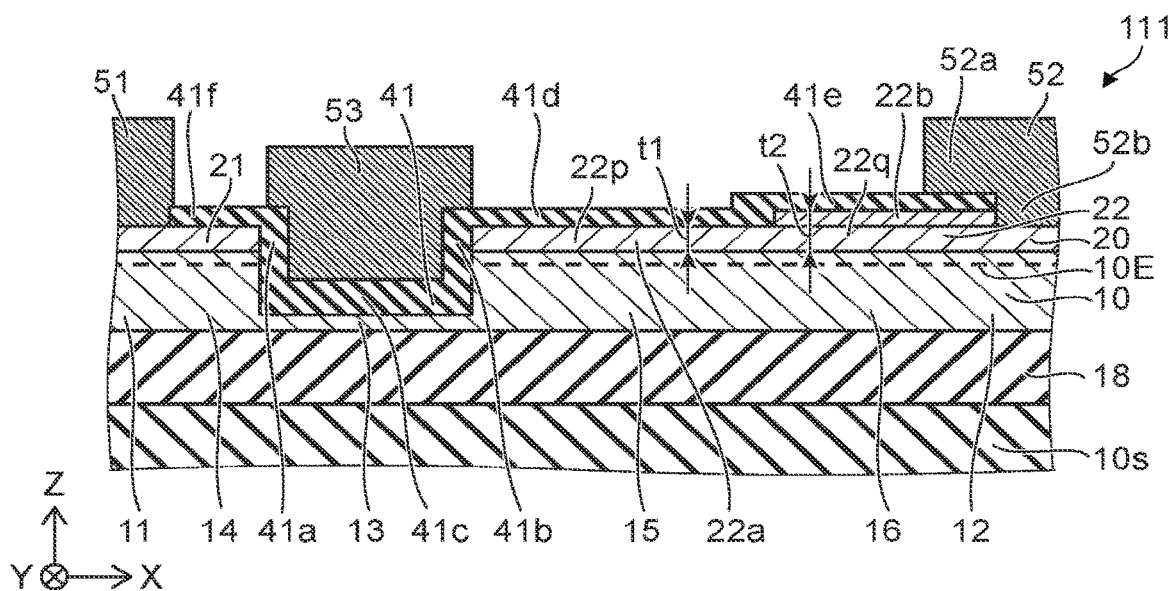
FIG. 3 is a schematic cross-sectional view illustrating a semiconductor device according to the first embodiment.

FIG. 3 is a schematic cross-sectional view illustrating a semiconductor device according to the first embodiment.

In the semiconductor device 111 according to the embodiment as shown in FIG. 3, a first layer 22a and a second layer 22b are provided in the second semiconductor region 22. Otherwise, the configuration of the semiconductor device 111 may be similar to the configuration of the semiconductor device 110.

The first layer 22a and the second layer 22b are included in the second semiconductor region 22. The first layer 22a is included in the first and second semiconductor parts 22p and 22q. The second layer 22b is included in the second semiconductor part 22q but is not included in the first semiconductor part 22p. In the second semiconductor part 22q, the first layer 22a is between the sixth partial region 16 and the second layer 22b.

The first layer 22a has the first thickness t1 described above. The sum of the thicknesses of the first thickness t1 and the second layer 22b is the second thickness t2.

It is favorable for the thickness of the second layer 22b to be, for example, not less than 1 nm and not more than 15 nm. For example, homogeneous film properties in the thickness direction (the Z-axis direction) are easily obtained by such a thickness. For example, the degradation of the reliability due to cracking of the layers does not occur easily.

The first layer 22a includes $Al_{x2}Ga_{1-x2}N$ ($0<x2<1$ and $x1<x2$). The second layer 22b includes $Al_{x2}Ga_{1-x2}N$ ($0<x2<1$ and $x1<x2$). The Al composition ratio in the second layer 22b may be different from the Al composition ratio in the first layer 22a. In such a case, the Al composition ratio in the second semiconductor region 22 may be the average (e.g., the average that reflects the volume ratio) of the Al composition ratio in the first layer 22a and the Al composition ratio in the second layer 22b. The Al composition ratio in the second layer 22b may be greater than the Al composition ratio in the first layer 22a. A high carrier concentration CR is easily obtained thereby.

The second layer 22b includes, for example, crystalline AlN or crystalline AlGaN. The first layer 22a includes, for example, crystalline AlGaN. The boundary between the first layer 22a and the second layer 22b may be indistinct. The portion that forms the thickness difference between the second semiconductor part 22q and the first semiconductor part 22p may be considered to be the second layer 22b. Silicon or the like (e.g., an impurity) may be included at the boundary between the first layer 22a and the second layer 22b. For example, a high carrier concentration CR is easily obtained thereby. For example, current collapse is more easily suppressed.

Figure 4:
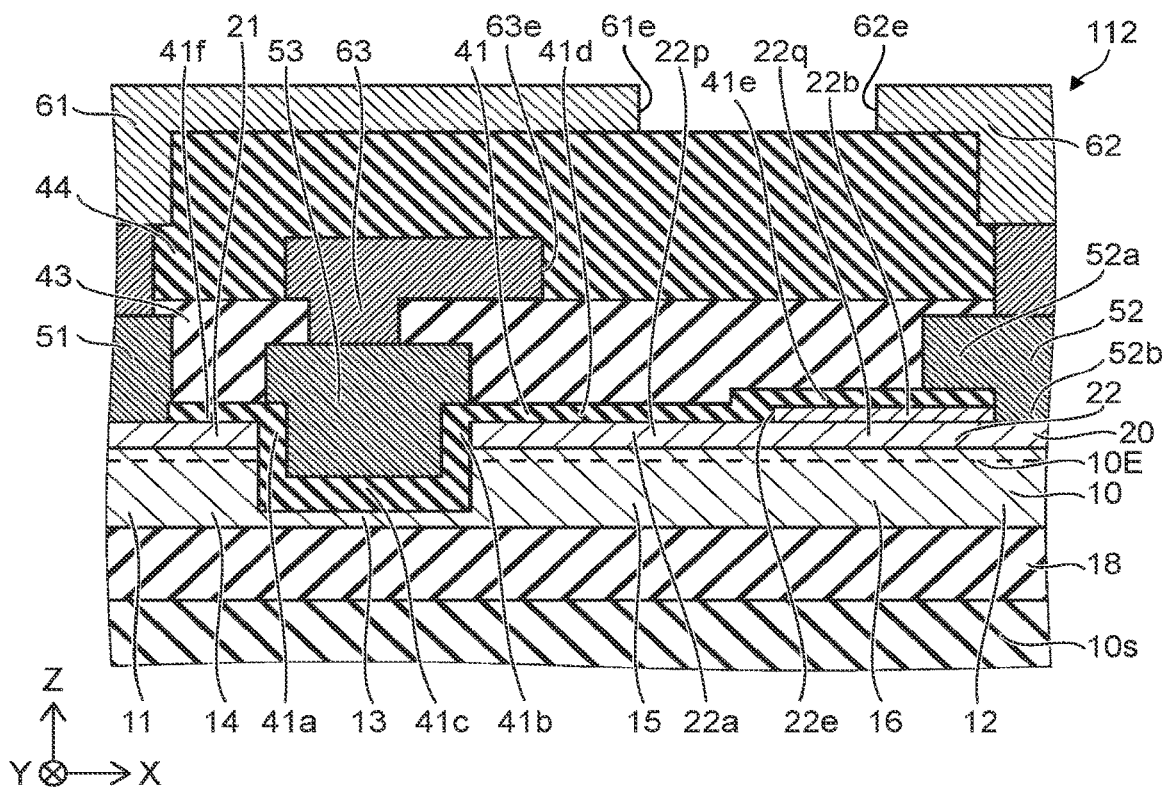
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, the semiconductor device 112 according to the embodiment includes conductive members (a first conductive member 61, a second conductive member 62, a third conductive member 63, etc.). Otherwise, the configuration of the semiconductor device 112 may be similar to the configuration of the semiconductor device 110 or 111.

The first conductive member 61 is electrically connected to the first electrode 51. For example, the third electrode 53 is between the third partial region 13 and the first conductive member 61 in the second direction (the Z-axis direction). For example, the first conductive member 61 functions as a field plate. The position in the first direction (the X-axis direction) of an end portion 22e of the second semiconductor part 22q at the third electrode 53 side is between the position in the first direction of the second electrode 52 and the position in the first direction of an end portion 61e of the first conductive member 61 at the second electrode 52 side.

The second conductive member 62 is electrically connected to the second electrode 52. A portion of the second semiconductor part 22q is between the sixth partial region 16 and the second conductive member 62 in the second direction (the Z-axis direction). For example, the second conductive member 62 functions as a field plate. The position in the first direction (the X-axis direction) of the end portion 22e of the second semiconductor part 22q at the third electrode 53 side is between the position in the first direction of the end portion 61e of the first conductive member 61 at the second electrode 52 side and the position in the first direction of an end portion 62e of the second conductive member 62 at the third electrode 53 side.

The third conductive member 63 is electrically connected to the third electrode 53. A portion of the first semiconductor part 22p is between the fifth partial region 15 and the third conductive member 63 in the second direction (the Z-axis direction). For example, the third conductive member 63 functions as a field plate. The position in the first direction (the X-axis direction) of the end portion 22e of the second semiconductor part 22q at the third electrode 53 side is between the position in the first direction of an end portion 63e of the third conductive member 63 at the second electrode 52 side and the position in the first direction of the end portion 62e of the second conductive member 62 at the third electrode 53 side.

The concentration of the electric field is suppressed by such conductive members. More stable characteristics are obtained. As shown in FIG. 4, an insulating member 43 and an insulating member 44 may be provided between the semiconductor layers and the conductive members.

Figure 5:
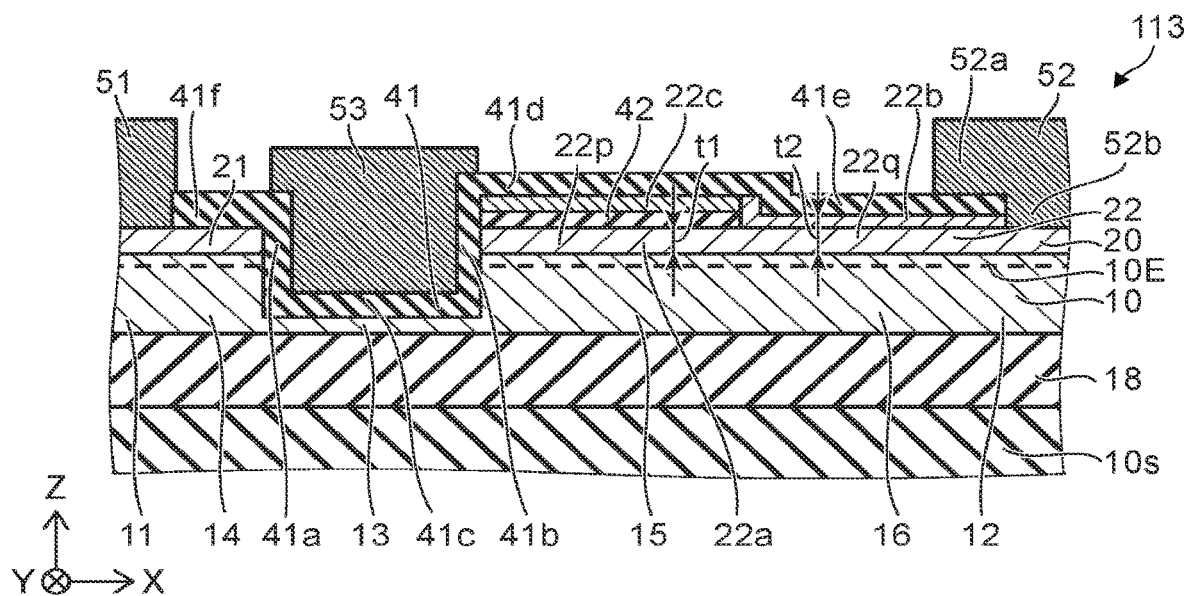
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, the semiconductor device 113 according to the embodiment includes a third layer 22c and a second insulating member 42. Otherwise, the configuration of the semiconductor device 113 may be similar to the configuration of the semiconductor device 111.

The third layer 22c includes $Al_{x3}Ga_{1-x3}N$ ($0<x3<1$ and $x1<x3$). The second insulating member 42 is located between the first semiconductor part 22p and the third layer 22c.

The first insulating member 41 may include the fourth insulating region 41d and the fifth insulating region 41e in addition to the first to third insulating regions 41a to 41c. The second insulating member 42 is between the first semiconductor part 22p and the fourth insulating region 41d. The third layer 22c is between the second insulating member 42 and the fourth insulating region 41d. The second semiconductor part 22q is between the sixth partial region 16 and the fifth insulating region 41e in the second direction (the Z-axis direction).

In the semiconductor device 113, the second semiconductor region 22 may include the first layer 22a and the second layer 22b. The first layer 22a is included in the first and second semiconductor parts 22p and 22q. The second layer 22b is included in the second semiconductor part 22q and included in the first semiconductor part 22p. In the second semiconductor part 22q, the first layer 22a is between the sixth partial region 16 and the second layer 22b. The third layer 22c may be continuous with the second layer 22b. For example, the third layer 22c is between the first semiconductor part 22p and the fourth insulating region 41d. For example, the second layer 22b contacts the second electrode 52.

For example, the crystallinity of the second layer 22b is greater than the crystallinity of the third layer 22c. For example, the second layer 22b includes a crystal. At least a portion of the third layer 22c is amorphous. The entire third layer 22c may be amorphous.

For example, the first insulating member 41 includes silicon and oxygen. The second insulating member 42 includes silicon and nitrogen. For example, the first insulating member 41 is silicon oxide. The second insulating member 42 is, for example, silicon nitride. The first insulating member 41 may include, for example, Al. The first insulating member 41 may include, for example, AlSiO, etc. For example, the first insulating member 41 does not include nitrogen. Or, the nitrogen concentration in the first insulating member 41 is less than the nitrogen concentration in the second insulating member 42. For example, the second insulating member 42 does not include oxygen. Or, the oxygen concentration in the second insulating member 42 is less than the oxygen concentration in the first insulating member 41. For example, the third layer 22c that is located on such a second insulating member 42 easily becomes amorphous. By such a configuration, for example, the carrier concentration CR is easily reduced locally at the vicinity of the third electrode 53. For example, the gate leakage current IL that is caused by crystal grain boundaries can be suppressed.

For example, the third layer 22c that includes AlN or AlGaN is located between the second insulating member 42 and the fourth insulating region 41d. By such a configuration, for example, the threshold voltage is further stabilized. For example, it is considered that the penetration of hydrogen from the outside is suppressed by the stacked structure including the third layer 22c and the fourth insulating region 41d. More stable characteristics are easily obtained thereby.

In the embodiment, when the second insulating member 42 includes silicon and nitrogen, it is favorable for the nitrogen composition ratio in the second insulating member 42 to be, for example, greater than 1.25 and not more than 1.67. The composition ratio is the ratio of the number of nitrogen atoms to the number of silicon atoms. Because the second insulating member 42 is nitrogen-rich silicon nitride, for example, the gate leakage current IL can be more effectively suppressed. For example, a high device breakdown voltage is obtained.

Figure 6:
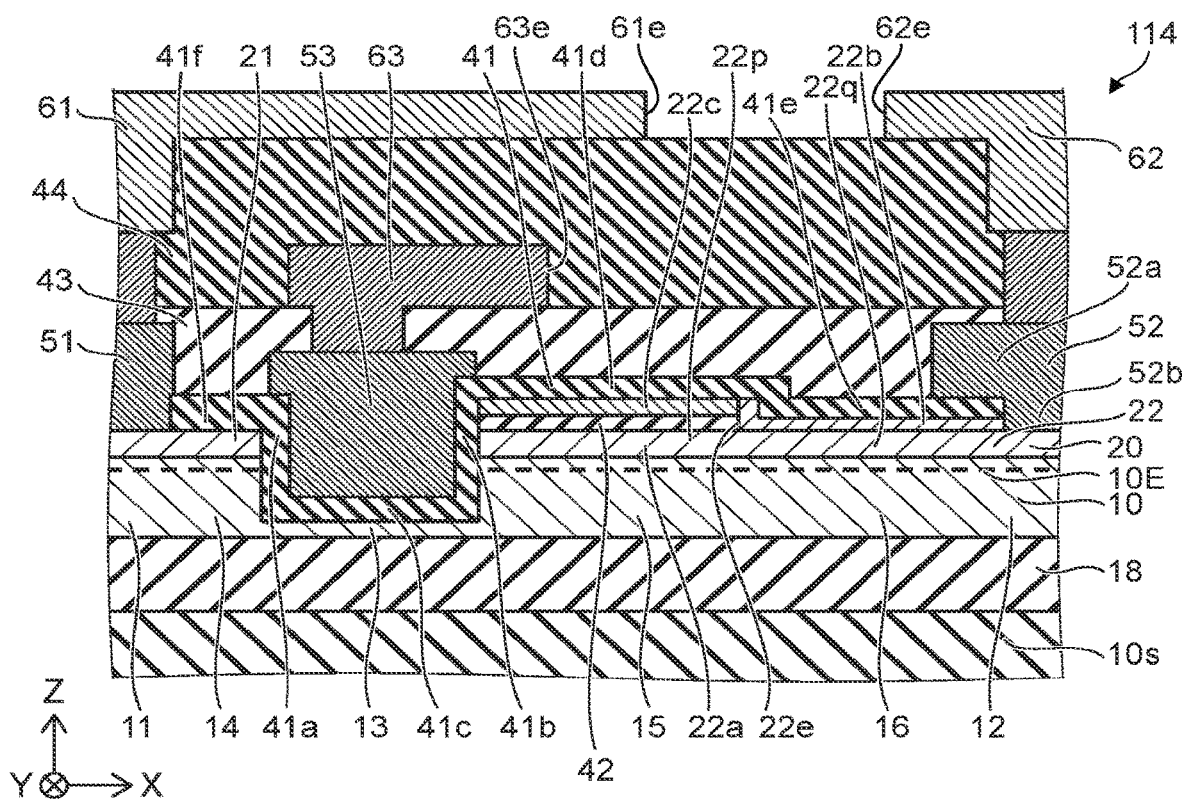
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, the semiconductor device 114 according to the embodiment includes conductive members (the first conductive member 61, the second conductive member 62, the third conductive member 63, etc.). Otherwise, the configuration of the semiconductor device 114 may be similar to the configuration of the semiconductor device 113. The concentration of the electric field is suppressed. More stable characteristics are obtained.

Second Embodiment

A second embodiment relates to a method for manufacturing a semiconductor device.

FIGS. 7A to 7D and FIGS. 8A to 8D are schematic cross-sectional views illustrating the method for manufacturing the semiconductor device according to the second embodiment.

Figure 7A:
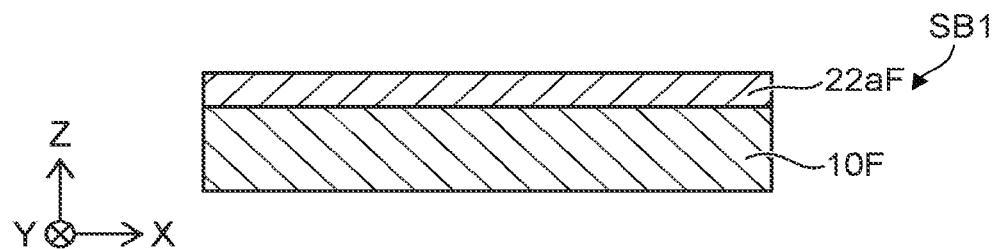
FIGS. 7A to 7D are schematic cross-sectional views illustrating a method for manufacturing a semiconductor device according to a second embodiment.

As shown in FIG. 7A, a structure body SB1 that includes a semiconductor layer 10F used to form the first semiconductor layer 10 and a semiconductor layer 22aF used to form the first layer 22a is prepared. The structure body SB1 may be located on the base body 10s and the buffer layer 18 (referring to FIG. 1).

Figure 7B:
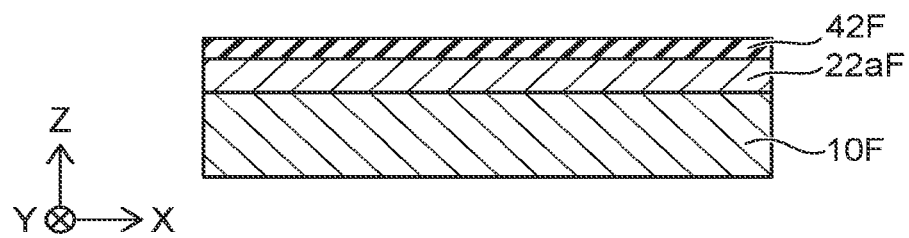

As shown in FIG. 7B, an insulating member 42F (e.g., a silicon nitride layer) that is used to form the second insulating member 42 is formed on the structure body SB1.

Figure 7C:
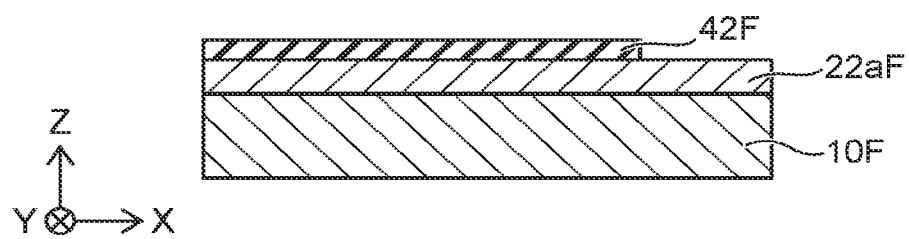

A portion of the insulating member 42F is removed as shown in FIG. 7C.

Figure 7D:
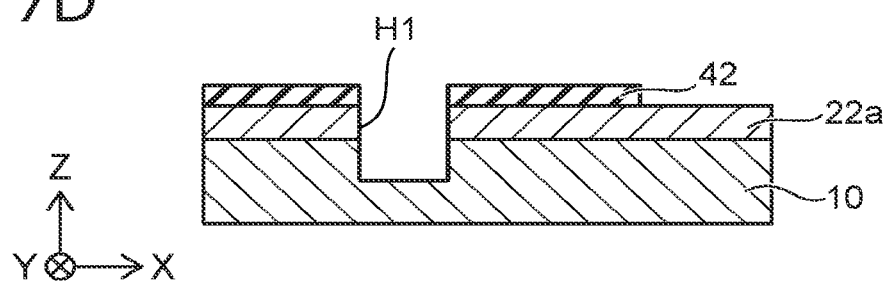

As shown in FIG. 7D, a recess H1 is formed by removing another portion of the insulating member 42F, a portion of the semiconductor layer 22aF and a portion of the semiconductor layer 10F.

Figure 8A:
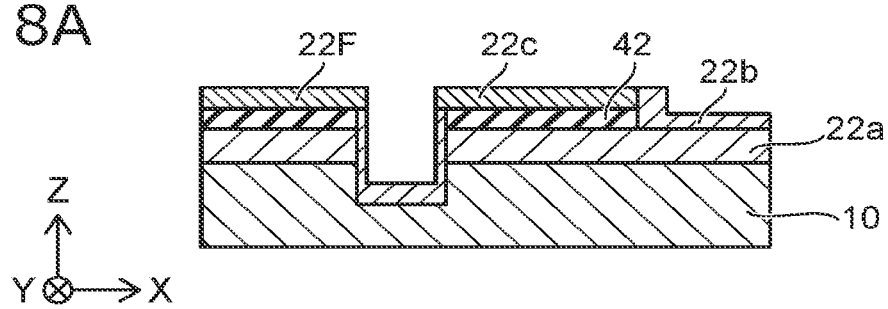
FIGS. 8A to 8D are schematic cross-sectional views illustrating the method for manufacturing the semiconductor device according to the second embodiment.

As shown in FIG. 8A, the second layer 22b and the third layer 22c can be formed by forming a nitride semiconductor layer 22F that includes Al. The second layer 22b is crystalline, and the third layer 22c is amorphous.

Figure 8B:
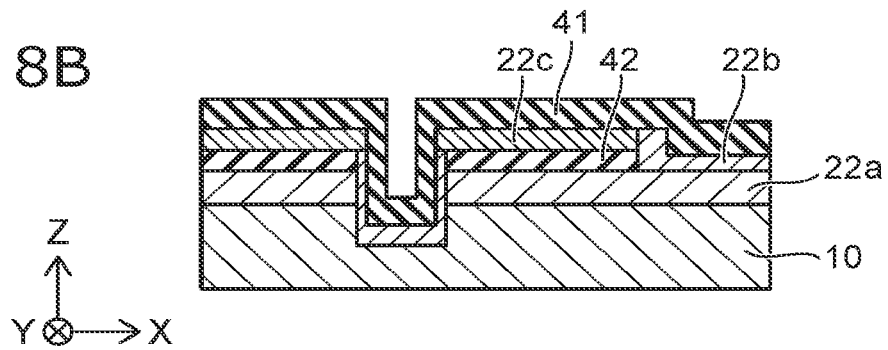
Figure 8C:
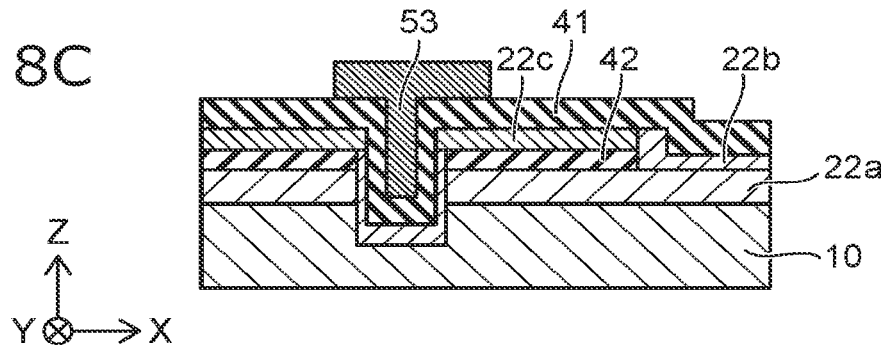
Figure 8D:
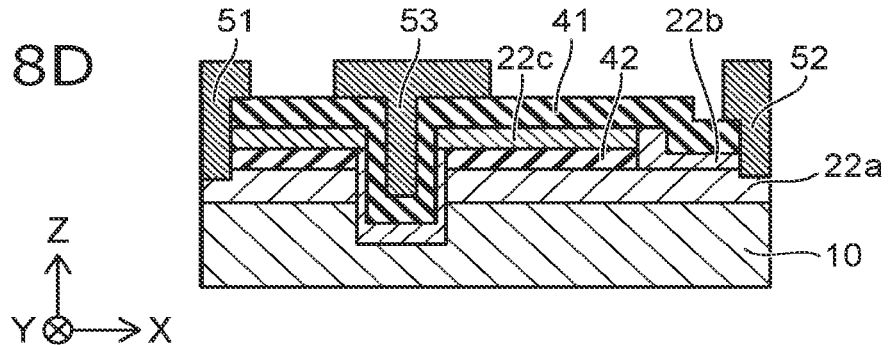

The first insulating member 41 (e.g., a silicon oxide layer) is formed as shown in FIG. 8B. The third electrode 53 is formed as shown in FIG. 8C. The first electrode 51 and the second electrode 52 are formed as shown in FIG. 8D. Thus, for example, the semiconductor device 113, etc., are obtained.

In the processes described above, the nitride semiconductor layer 22F that is formed in the recess H1 may be removed. The nitride semiconductor layer 22F may be formed by providing a mask so that the nitride semiconductor layer 22F is not formed in the recess H1.

The first electrode 51 and the second electrode 52 include, for example, at least one selected from the group consisting of Ti and Al. The third electrode 53 includes, for example, at least one selected from the group consisting of TiN, TiW, WN, Pt, Ni, and Au. The first to third conductive members 61 to 63 include, for example, at least one selected from the group consisting of Al, Cu, Au, and Ag.

According to the embodiments, a semiconductor device can be provided in which stable characteristics are obtained.

In the specification, "nitride semiconductor" includes all compositions of semiconductors of the chemical formula $B_x In_y Al_z Ga_{1-x-y-z} N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode; and
a third electrode, a position of the third electrode in a first direction being between a position of the first electrode in the first direction and a position of the second electrode in the first direction, the first direction being from the first electrode toward the second electrode;
a first semiconductor layer including $Al_{x1}Ga_{1-x1}N$ ($0 \le x1 < 1$) and including a first partial region, a second partial region, a third partial region, a fourth partial region, a fifth partial region, and a sixth partial region, a second direction from the first partial region toward the first electrode crossing the first direction, a direction from the second partial region toward the second electrode being along the second direction, a direction from the third partial region toward the third electrode being along the second direction, a position in the first direction of the fourth partial region being between a position in the first direction of the first partial region and a position in the first direction of the third partial region, a position in the first direction of the fifth partial region being between the position in the first direction of the third partial region and a position in the first direction of the second partial region, a position in the first direction of the sixth partial region being between the position in the first direction of the fifth partial region and the position in the first direction of the second partial region;
a second semiconductor layer including $Al_{x2}Ga_{1-x2}N$ ($0 < x2 < 1$ and $x1 < x2$) and including a first semiconductor region and a second semiconductor region, a direction from the fourth partial region toward the first semiconductor region being along the second direction, a direction toward the second semiconductor region from the fifth and sixth partial regions being along the second direction, at least a portion of the third electrode being between the first semiconductor region and the second semiconductor region in the first direction, the second semiconductor region including a first semiconductor part and a second semiconductor part, the first semiconductor part being between the second semiconductor part and the at least a portion of the third electrode in the first direction, a first thickness along the second direction of the first semiconductor part being less than a second thickness along the second direction of the second semiconductor part; and
a first insulating member including
 a first insulating region between the first semiconductor region and the at least a portion of the third electrode in the first direction,
 a second insulating region between the second semiconductor region and the at least a portion of the third electrode in the first direction, and
 a third insulating region between the third partial region and the third electrode in the second direction.

2. The device according to claim 1, wherein
the first insulating member further includes a fourth insulating region and a fifth insulating region,
the first semiconductor part is between the fifth partial region and the fourth insulating region,
the second semiconductor part is between the sixth partial region and the fifth insulating region, and
a portion of the fifth insulating region is between a portion of the second semiconductor part and a portion of the second electrode in the second direction.

3. The device according to claim 1, wherein
the second semiconductor region includes a first layer and a second layer,
the first layer is included in the first and second semiconductor parts,
the second layer is included in the second semiconductor part but not included in the first semiconductor part, and
the first layer is between the sixth partial region and the second layer in the second semiconductor part.

4. The semiconductor device according to claim 1, further comprising:
a third layer including $Al_{x3}Ga_{1-x3}N$ ($0 < x3 < 1$ and $x1 < x3$); and
a second insulating member provided between the first semiconductor part and the third layer.

5. The device according to claim 4, wherein
the second semiconductor region includes a first layer and a second layer,
the first layer is included in the first and second semiconductor parts,
the second layer is included in the second semiconductor part but not included in the first semiconductor part,
the first layer is between the sixth partial region and the second layer in the second semiconductor part, and
the third layer is continuous with the second layer.

6. The device according to claim 5, wherein
a thickness of the second layer is not less than 1 nm and not more than 15 nm.

7. The device according to claim 5, wherein
a crystallinity of the second layer is greater than a crystallinity of the third layer.

8. The device according to claim 5, wherein
the second layer includes a crystal, and
the third layer is amorphous.

9. The device according to claim 4, wherein
the first insulating member includes silicon and oxygen, and
the second insulating member includes silicon and nitrogen.

10. The device according to claim 9, wherein
the first insulating member does not include nitrogen, or a concentration of nitrogen in the first insulating member is less than a concentration of nitrogen in the second insulating member, and
the second insulating member does not include oxygen, or a concentration of oxygen in the second insulating member is less than a concentration of oxygen in the first insulating member.

11. The device according to claim 9, wherein
the second insulating member includes silicon and nitrogen, and
a composition ratio of nitrogen in the second insulating member is greater than 1.25 and not more than 1.67.

12. The device according to claim 5, wherein
the first insulating member further includes a fourth insulating region and a fifth insulating region,
the second insulating member is between the first semiconductor part and the fourth insulating region,
the third layer is between the second insulating member and the fourth insulating region, and
the second semiconductor part is between the sixth partial region and the fifth insulating region in the first direction.

13. The device according to claim 12, wherein
the first insulating region, the second insulating region, the third insulating region, the fourth insulating region, and the fifth insulating region are continuous with each other.

14. The device according to claim 5, wherein
the second layer contacts the second electrode.

15. The device according to claim 1, wherein
the second electrode includes a first electrode part and a second electrode part,
a portion of the second semiconductor part is between the sixth partial region and the first electrode part in the second direction,
a direction from the portion of the second semiconductor part toward the second electrode part is along the first direction, and
the portion of the second semiconductor part contacts the second electrode part.

16. The device according to claim 15, wherein
a length along the first direction of the first electrode part is not less than 0.01 μm and not more than 0.2 μm.

17. The device according to claim 15, wherein
a length along the first direction of the second semiconductor part is not less than 0.3 μm and not more than 7 μm.

18. The device according to claim 1, further comprising:
a first conductive member electrically connected to the first electrode,
the third electrode being between the third partial region and the first conductive member in the second direction,
a position in the first direction of an end portion of the second semiconductor part at the third electrode side being between a position in the first direction of an end portion of the first conductive member at the second electrode side and a position in the first direction of the second electrode.

19. The device according to claim 18, further comprising:
a second conductive member electrically connected to the second electrode,
a portion of the second semiconductor part being between the sixth partial region and the second conductive member in the second direction,
the position in the first direction of the end portion of the second semiconductor part at the third electrode side being between the position in the first direction of the end portion of the first conductive member at the second electrode side and a position in the first direction of an end portion of the second conductive member at the third electrode side.

20. The device according to claim 19, further comprising:
a third conductive member electrically connected to the third electrode,
a portion of the first semiconductor part being between the fifth partial region and the third conductive member in the second direction,
the position in the first direction of the end portion of the second semiconductor part at the third electrode side being between a position in the first direction of an end portion of the third conductive member at the second electrode side and the position in the first direction of the end portion of the second conductive member at the third electrode side.

* * * * *